(12) United States Patent
Castelli et al.

(10) Patent No.: US 10,170,167 B2
(45) Date of Patent: *Jan. 1, 2019

(54) SINGLE NODE POWER MANAGEMENT FOR MULTIPLE MEMORY DEVICES

(71) Applicant: Micron Technology, Inc., Boise, ID (US)

(72) Inventors: Mauro Castelli, Avezzano (IT); Luca De Santis, Avezzano (IT); Luigi Pilolli, L' Aquila (IT); Maria Luisa Gallese, Avezzamp (IT)

(73) Assignee: Micron Technology, Inc., Boise, ID (US)

( * ) Notice: Subject to any disclaimer, the term of this patent is extended or adjusted under 35 U.S.C. 154(b) by 11 days.

This patent is subject to a terminal disclaimer.

(21) Appl. No.: 15/162,128

(22) Filed: May 23, 2016

(65) Prior Publication Data

US 2016/0267953 A1  Sep. 15, 2016

Related U.S. Application Data

(63) Continuation of application No. 14/476,323, filed on Sep. 3, 2014, now Pat. No. 9,349,423.

(51) Int. Cl.
  *G11C 7/22* (2006.01)
  *G11C 5/14* (2006.01)
  *G11C 7/06* (2006.01)
  *G11C 8/10* (2006.01)
  *G11C 5/04* (2006.01)

(52) U.S. Cl.
  CPC .............. *G11C 7/222* (2013.01); *G11C 5/14* (2013.01); *G11C 7/062* (2013.01); *G11C 8/10* (2013.01); *G11C 5/04* (2013.01)

(58) Field of Classification Search
  CPC ................ G11C 5/14; G11C 5/04; G11C 5/02
  USPC .................................................. 365/191, 226
  See application file for complete search history.

(56) References Cited

U.S. PATENT DOCUMENTS

| 4,933,901 A | * | 6/1990 | Tai | ............................ G06F 5/14 365/189.07 |
| 9,349,423 B2 | | 5/2016 | Castelli et al. | |
| 2011/0208906 A1 | * | 8/2011 | Gillingham | ........... G06F 1/3203 711/105 |
| 2014/0195734 A1 | * | 7/2014 | Ha | ........................ G06F 1/3237 711/114 |

(Continued)

OTHER PUBLICATIONS

Keeth et al., DRAM Circuit Design: Fundamental and High Speed Topics, Chapter 1: An Introduction to DRAM, Dec. 2007, Wiley-IEEE Press.*

(Continued)

*Primary Examiner* — Tha-O H Bui
*Assistant Examiner* — Alfredo Bermudez Lozada
(74) *Attorney, Agent, or Firm* — Schwegman Lundberg & Woessner, P.A.

(57) ABSTRACT

Some embodiments include apparatuses and methods having a node to couple to a plurality of memory devices, memory cells, and a module to perform an operation on the memory cells, to cause at least one change in a level of a signal at the node in order to make a request to perform a particular stage of the operation such that the request is detectable by the memory devices, and to perform the particular stage of the operation after the request is acknowledged. Other embodiments are described.

18 Claims, 12 Drawing Sheets

(56) References Cited

U.S. PATENT DOCUMENTS

2016/0064052 A1  3/2016  Castelli et al.

OTHER PUBLICATIONS

Keeth, et al., "DRAM Circuit Design: Fundamental and High Speed Topics", Chapter 1: An Introduction to DRAM, (Dec. 2007), 33 pgs.

* cited by examiner

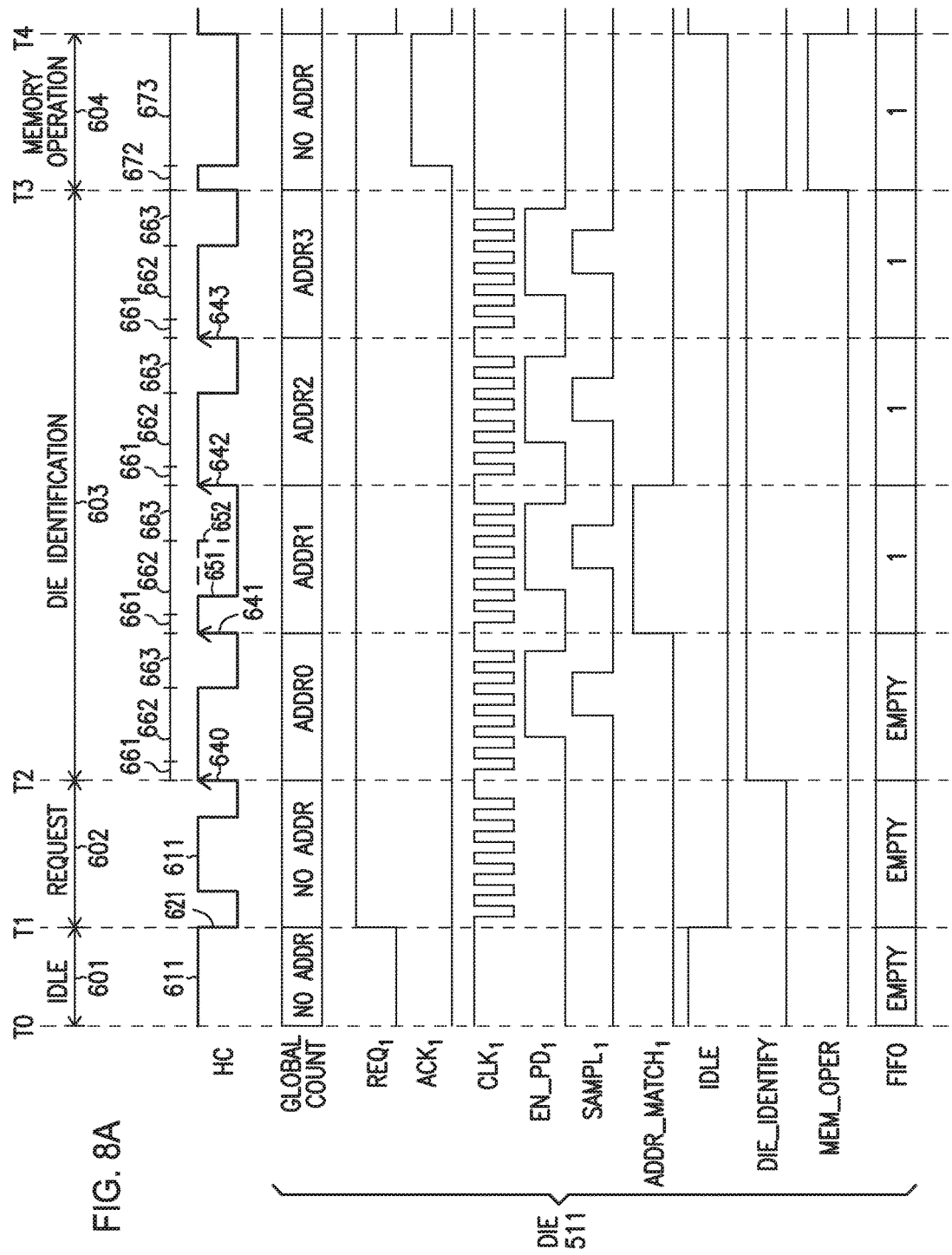

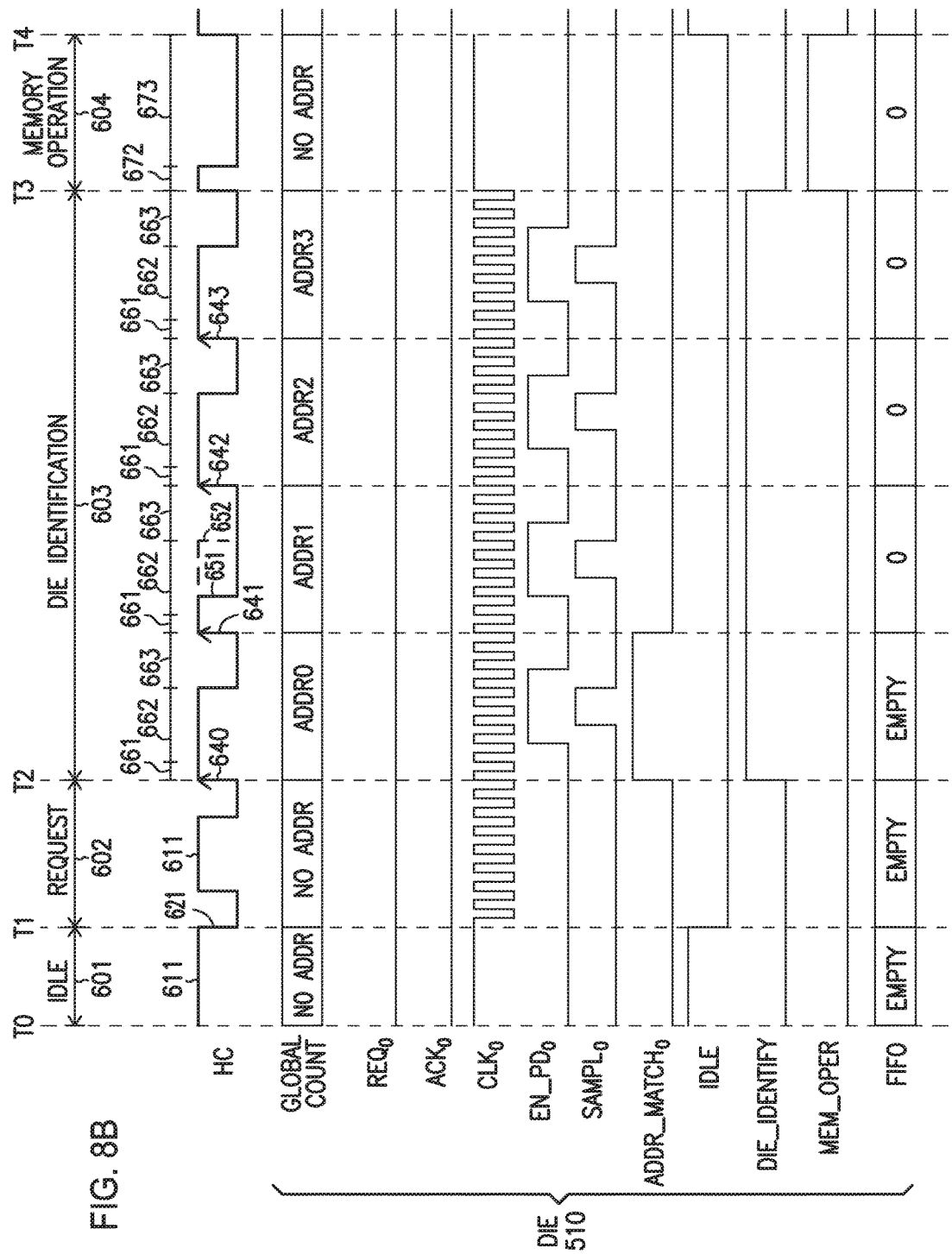

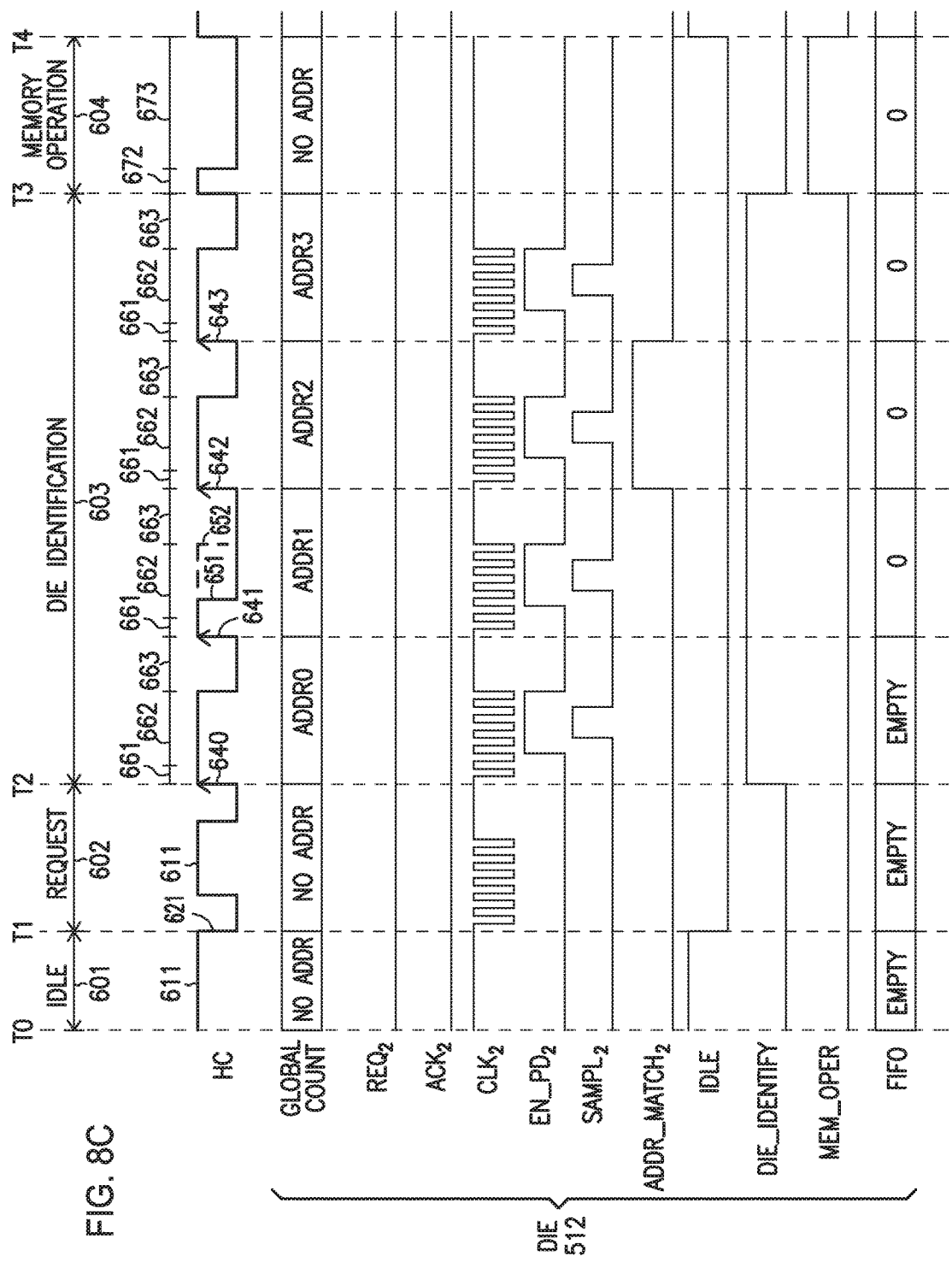

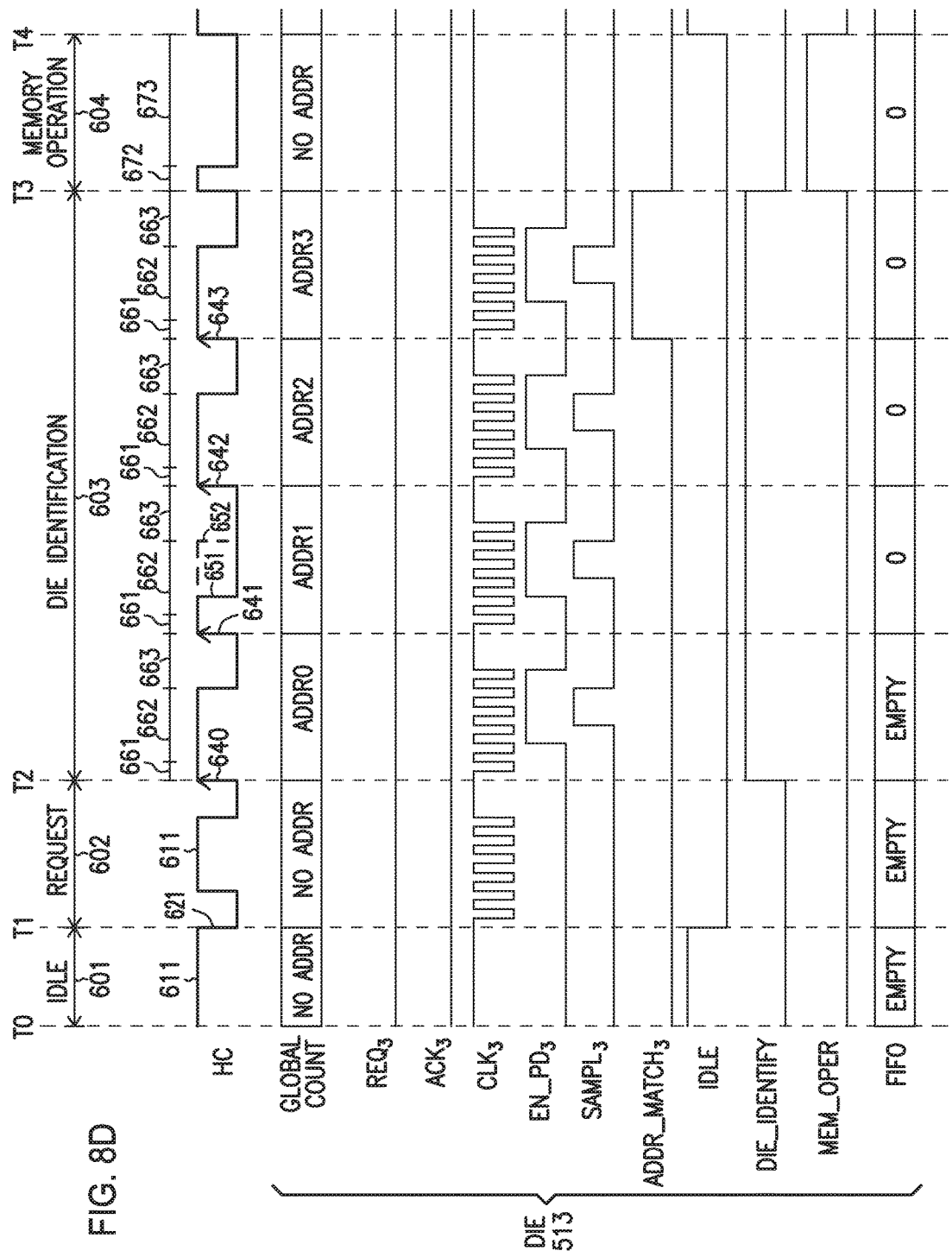

SINGLE NODE POWER MANAGEMENT FOR MULTIPLE MEMORY DEVICES

PRIORITY APPLICATION

This application is a continuation of U.S. application Ser. No. 14/476,323, filed Sep. 3, 2014, which is incorporated herein by reference in its entirety.

BACKGROUND

Many electronic systems, such as computers and mobile devices, usually include a memory to store information. Some memory may include a number of memory devices in the same package to increase storage capacity. In order to control peak power consumption in such a package, the memory devices in the package may communicate among each other through multiple pads during some operations performed by the memory devices. In some conventional packages, employing multiple conductive pads for such communication may increase the area of each memory device in the package, increase overall cost, or both.

BRIEF DESCRIPTION OF THE DRAWINGS

FIG. 8A through FIG. 8D show timing for some signals in different dice in an operation of the package of FIG. 5, according to an embodiment of the invention.

DETAILED DESCRIPTION

Figure 1:
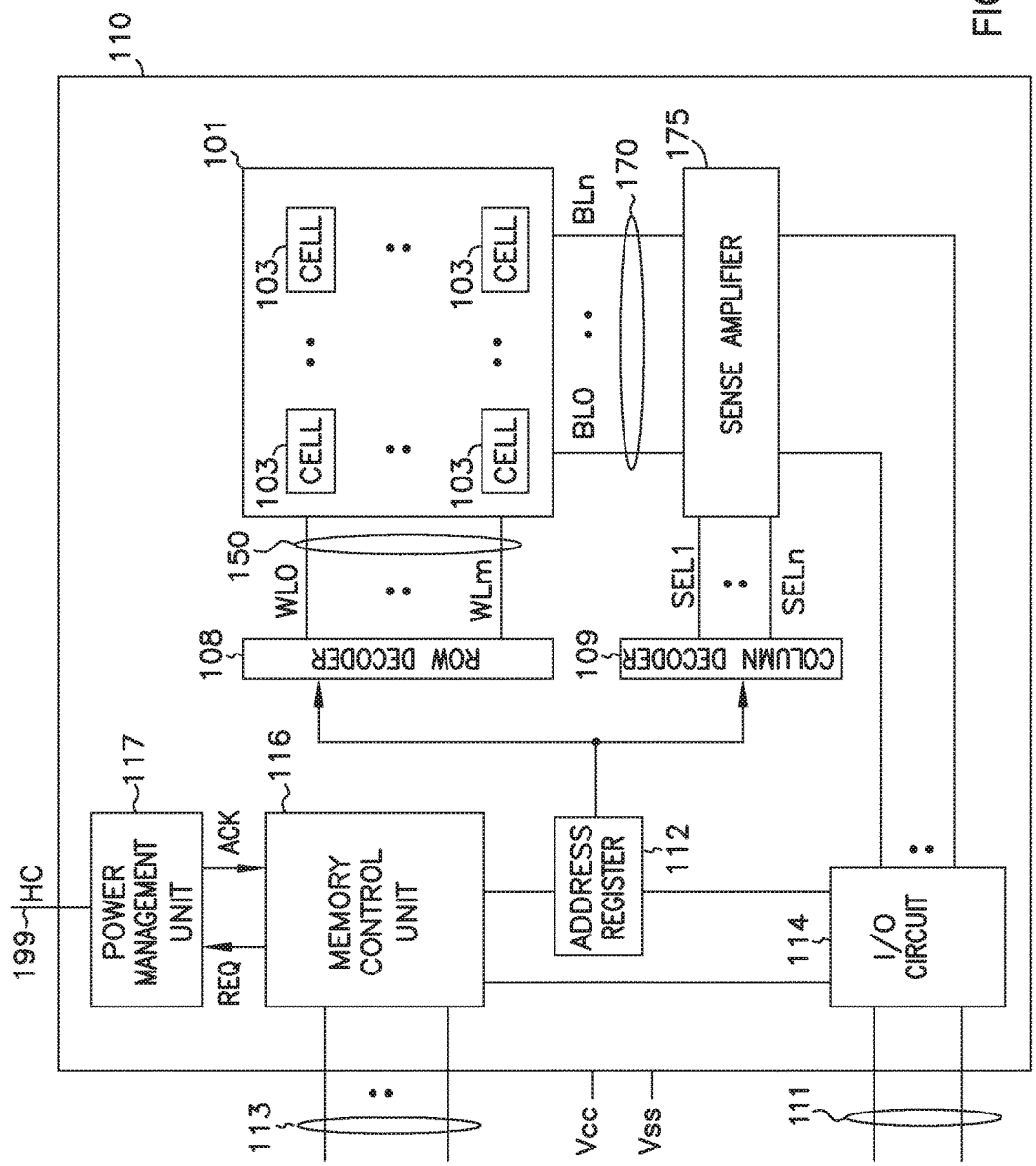
FIG. 1 shows a block diagram of an apparatus in the form of a memory device having a memory array and memory cells, according to an embodiment of the invention.

FIG. 1 shows a block diagram of an apparatus in the form of a memory device 110 having a memory array 101 and memory cells 103, according to an embodiment of the invention. Memory cells 103 can be arranged in rows and columns along with lines 150 and lines 170. Lines 150 can carry signals WL0 through WLm and can form part of access lines (e.g., word lines) of memory device 110. Lines 170 can carry signals BL0 through BLn and can form part of data lines (e.g., bit lines) of memory device 110.

A row decoder 108 and a column decoder 109 can respond to an address register 112 to access memory cells 103 based on row address and column address signals on lines 111, 113, or both. A sense amplifier 175 can operate to determine the values of information to be stored in memory cells 103 or the values of information obtained from memory cells 103. Sense amplifier 175 can respond to signals SLE1 through SLEn to selectively provide information between memory cells 103 an input/output (I/O) circuit 114. I/O circuit 114 can be configured to exchange information (e.g., in the form of signals) between sense amplifier 175 and lines 111. Lines 111 and 113 can include nodes within memory device 110 or pins (or solder balls) on a package where memory device 110 is located.

Memory device 110 can receive supply voltages Vcc and Vss. Supply voltage Vss can operate at a ground potential (e.g., having a value of approximately zero volts). Supply voltage Vcc can include an external voltage supplied to memory device 110 from an external power source such as a battery or an alternating-current to direct-current (AC-DC) converter circuitry.

A memory control unit 116 can control operations of memory device 110 based on signals on lines 111 and 113. A device (e.g., a processor or a memory controller) external to memory device 110 can send different commands (e.g., read, write, or erase command) to memory device 110 using different combinations of signals on lines 111, 113, or both.

Memory device 110 can respond to commands to perform memory operations on memory cells 103. For example, memory device 110 can perform a read operation to determine the value of information stored in memory cells 103 and a write (e.g., programming) operation to store (e.g., program) information in memory cells 103. Memory device 110 can also perform an erase operation to erase information from some or all of memory cells 103.

In an example operation (e.g., read, write, or erase operation) memory control unit 116 may start the operation in response to a command (e.g., read, write, or erase command) from an external device (e.g., a processor or a memory controller). At a certain time after the operation is started, memory control unit 116 may make a request (e.g., by using a signal REQ) to perform a particular stage of the operation. Memory control unit 116 may perform the particular stage after the request is acknowledged. The particular stage may consume a relatively higher power resource (e.g., a higher current) than other stages of the operation. For example, the particular stage may include a stage where lines 170 are charged (e.g., precharged) as part of a process of storing information in memory cells 103 in a write operation or as part of a process of sensing (e.g., reading) information from memory cells 103 in a read operation.

As shown in FIG. 1, memory device 110 can include a node 199 that can carry a signal HC. Node 199 may be coupled to an additional device (or multiple devices) in a multi-chip arrangement (e.g., a memory chip package). In such an arrangement, power resources (e.g., voltage or current) may be shared among the devices. Memory device 110 may communicate with the device (or devices) in the arrangement through the HC signal in order to keep some parameters (e.g., peak current value) associated with the power resource within a specified (e.g., predetermined) value when memory device 110 performs a particular stage of an operation (e.g., read, write, or erase operation).

Memory device 110 can include a power management unit 117. In response to a request from memory control unit 116, power management unit 117 may communicate with other devices through the HC signal to acknowledge the request. Power management unit 117 may use an ACK signal to indicate that the request is acknowledged. Memory control unit 116 may perform the particular stage of the operation after the request is acknowledged.

FIG. 1 shows power management unit 117 being separated from other elements of memory device 110 as an example. However, a portion of power management unit 117 or the entire power management unit 117 can be part of another element or can include part of another element of memory device 110. For example, a portion of power management unit 117 or the entire power management unit 117 can be part of memory control unit 116 or other elements of memory device 110.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 110 can include a non-volatile memory device, and memory cells 103 can include non-volatile memory cells, such that memory cells 103 can retain information stored in them when power (e.g., Vcc, Vss, or both) is disconnected from memory device 110. For example, memory device 110 can be a flash memory device, such as a NAND flash or a NOR flash memory device, or another kind of memory device, such as a variable resistance memory device (e.g., a phase change or resistive random access memory (RAM) device).

Memory device 110 can include a memory device where memory cells 103 can be physically located in multiple levels on the same device (e.g., a 3D memory device), such that some of memory cells 103 can be stacked over some other memory cells 103 in multiple levels over a substrate (e.g., a semiconductor substrate) of memory device 110.

One of ordinary skill in the art may recognize that memory device 110 may include other elements, several of which are not shown in FIG. 1, so as not to obscure the example embodiments described herein.

At least a portion of memory device 110 can include structures and operations similar to or identical to memory devices described below with reference to FIG. 2 through FIG. 9.

Figure 2:
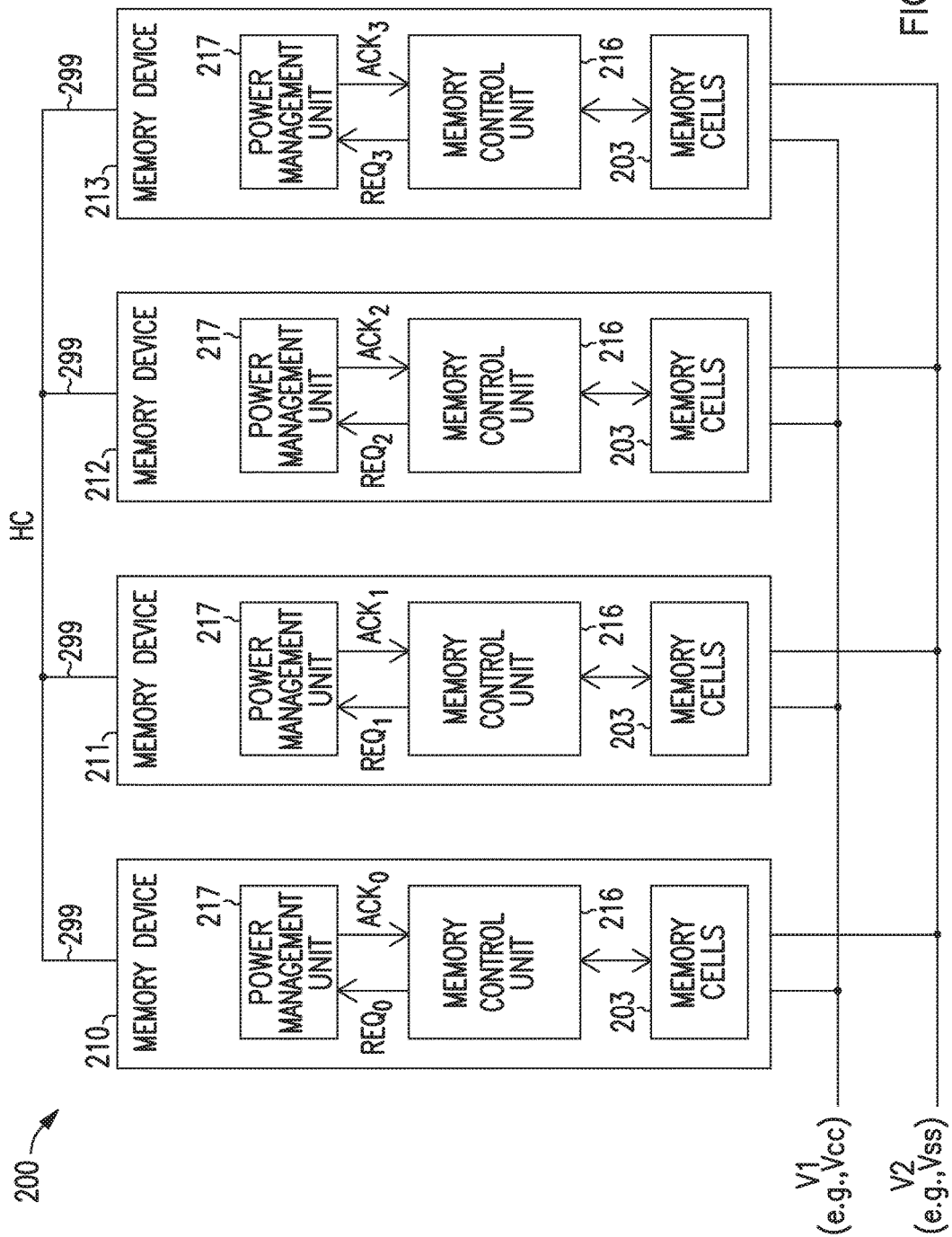
FIG. 2 shows a schematic diagram of an apparatus in the form of an arrangement of memory devices, according to an embodiment of the invention.

FIG. 2 shows a schematic diagram of an apparatus in the form of an arrangement 200 including memory devices 210, 211, 212, and 213, according to an embodiment of the invention. Arrangement 200 can include or be included in a package (e.g., a memory chip package). Each of memory devices 210, 211, 212, and 213 can include memory device 110 of FIG. 1. FIG. 2 shows an example of arrangement 200 having four memory devices. The number of memory devices in arrangement 200 can vary. As shown in FIG. 2, each of memory devices 210, 211, 212, and 213 can include memory cells 203, a memory control unit 216, and a power management unit 217 that can correspond to memory cells 103, memory control unit 116, and power management unit 117, respectively, of FIG. 1. For simplicity, FIG. 2 omits some components of memory devices 210, 211, 212, and 213.

Memory devices 210, 211, 212, and 213 can share power resources that can include voltages V1 and V2. Voltages V1 and V2 can include supply voltages Vcc and Vss, respectively.

As shown in FIG. 2, each of memory devices 210, 211, 212, and 213 can include a node 299, which can carry a signal HC. Node 299 of one memory device is coupled to node 299 of each of the other memory devices. Thus, a change (e.g., a transition) in a level of the HC signal can be detectable (e.g., can be recognized) by all memory devices 210, 211, 212, and 213. As described above, the change in a level of the HC signal can indicate a request made by a device to perform a particular stage of the operation in that memory device.

Node 299 may be structured as a conductive contact (e.g., a pad, pin, or solder ball). Node 299 of each of memory devices 210, 211, 212, and 213 can be included as part of the same conductive path (e.g., a common conductive path) shared by memory devices 210, 211, 212, and 213.

A device (e.g., a processor or a memory controller) external to memory devices 210, 211, 212, and 213 may send different commands (e.g., read, write, or erase command) to each of memory devices 210, 211, 212, and 213. Based on commands received from the external device, memory devices 210, 211, 212, and 213 can perform read, write, and erase operations that can be similar to, or identical to, those of memory device 110 of FIG. 1.

As described above with reference to FIG. 1, an operation (such as read, write, or erase operation) in a memory device may include a stage that may consume a relatively higher power resource (e.g., a higher current) than other stages of the operation. In order to keep some parameters (e.g., peak current value) associated with the power resource within a specified (e.g., predetermined) value during these operations, memory devices 210, 211, 212, and 213 may communicate among each other through the HC signal when they perform these operations. Memory devices 210, 211, 212, and 213 can be configured such that fewer than all of memory devices 210, 211, 212, and 213 can perform a particular stage (e.g., a higher current consumption stage) in these operations at a time. For example, memory devices 210, 211, 212, and 213 may be configured such that only one of memory devices 210, 211, 212, and 213 can perform a particular stage of an operation (e.g., of a read, write, or erase operation) at a time. In another example, memory devices 210, 211, 212, and 213 may be configured such that only two memory devices 210, 211, 212, and 213 can concurrently perform a particular stage of an operation.

Each of memory devices 210, 211, 212, and 213 can make a request to perform a particular stage of an operation after the operation is started and before such particular stage is performed. The request made by memory devices 210, 211, 212, and 213 can take the form of a signal such as one of $REQ_0$, $REQ_1$, $REQ_2$, and $REQ_3$ signals. In response to the request, memory devices 210, 211, 212, and 213 can perform a process to acknowledge (e.g., grant a permission to) the memory device that made the request. After the request is acknowledged, the memory device that made the request may perform the stage of the operation associated with the request. One of signals $ACK_0$, $ACK_1$, $ACK_2$, and $ACK_3$ can be used to indicate that the request made by a corresponding device is acknowledged.

In this description "request", when used alone, refers to a request to perform a particular stage of an operation (e.g., a read, write, or erase operation). Such a particular stage may or may not consume a higher power resource (e.g., a higher current) than another stage (or other stages) of that operation.

Figure 3:
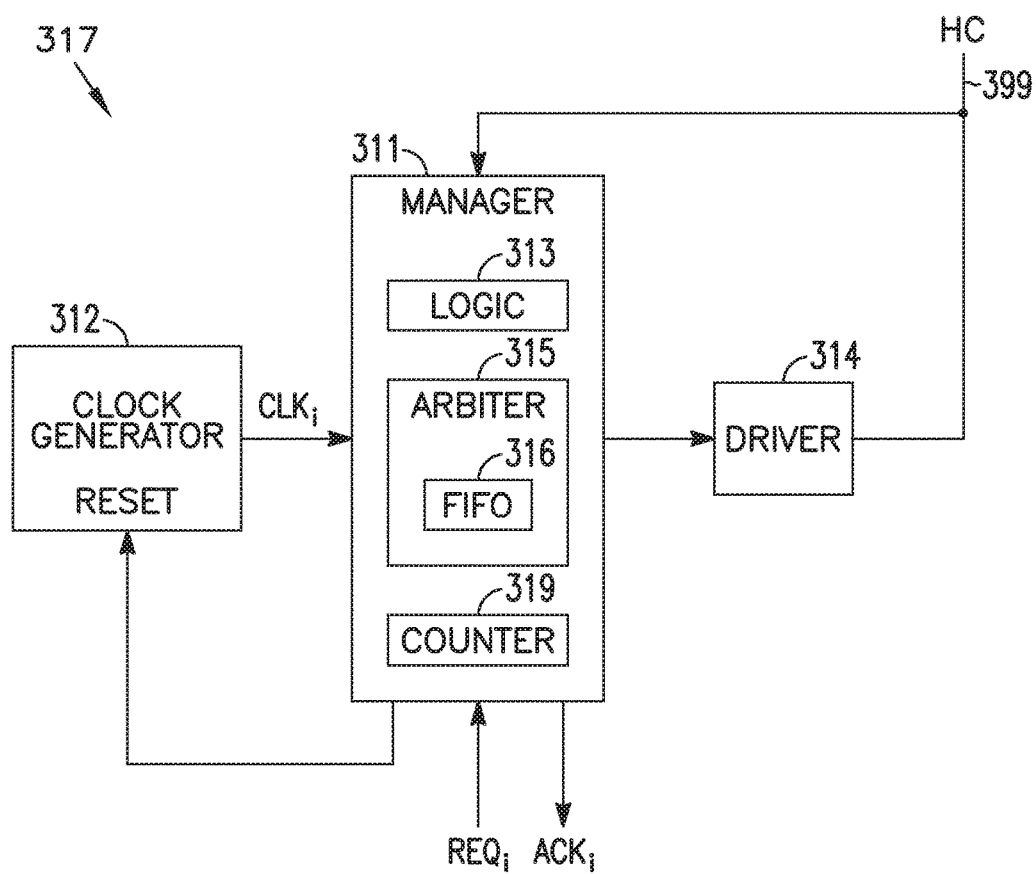
FIG. 3 shows a schematic diagram of a power management unit, according to an embodiment of the invention.

FIG. 3 shows a schematic diagram of a power management unit 317, according to an embodiment of the invention. Power management unit 317 can correspond to power management unit 217 in each of memory devices 210, 211, 212, and 213 of FIG. 2. As shown in FIG. 3, a power management unit 317 can include a manager 311, a clock generator 312, and driver 314 coupled to a node 399.

Clock generator 312 can include an oscillator to generate a clock signal CLKi. The CLKi signal can be different from another clock signal (e.g., a system clock signal) that a memory device (e.g., 210, 211, 212, or 213 in FIG. 2) may receive from another device (e.g., a processor or a memory controller).

Manager 311 can receive a signal REQi and generate a signal ACKi. The REQi signal can be generated by a control unit (e.g., memory control unit 216 of FIG. 2). The REQi signals can correspond to those of FIG. 2, such as the $REQ_0$, $REQ_1$, $REQ_2$, or $REQ_3$ signal. The ACKi signals in FIG. 3 can correspond to those of FIG. 2, such as the $ACK_0$, $ACK_1$, $ACK_2$, or $ACK_3$ signal.

Manager 311 can include logic 313, an arbiter 315, and a counter 319. Logic 313 can include a state machine. Arbiter 315 can include a first-in-first-out (FIFO) structure 316 to store information indicating an order in which a particular stage of an operation is to be performed. For example, if the number of memory devices in arrangement 200 is N, then FIFO structure 316 may include a memory that can store N bits. The content (e.g., value) of the N bits can indicate an order at which each of the memory devices can follow when it performs the particular stage of an operation.

Manager 311 may use logic 313 to control arbiter 315, clock generator 312, and driver 314. For example, manager 311 can provide control to input "RESET" of clock generator 312 based on the level of the HC signal on node 399. Based on the control from manager 311, clock generator 312 may cause the CLKi signal to continuously oscillate (e.g., to oscillate as a free running clock signal) or to intermittently oscillate (e.g., to oscillate not as a free running clock signal).

Manager 311 can control driver 314 such that driver 314 can hold the level of the HC signal on node 399 at a level (e.g., Vcc or Vss) or to cause the HC signal to change from one level to another level (e.g., from Vcc to Vss or from Vss to Vcc).

Figure 4:
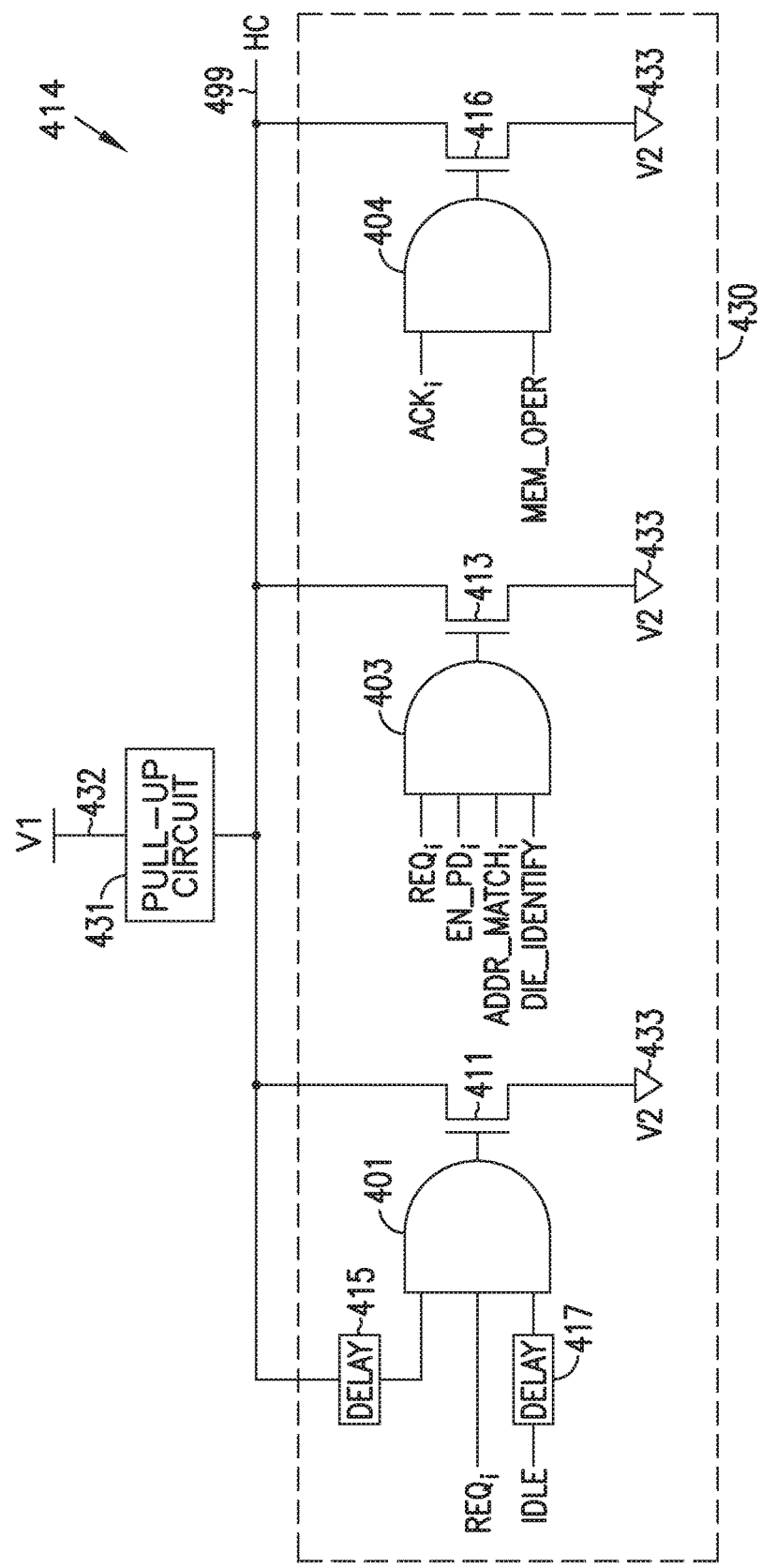
FIG. 4 shows a schematic diagram of a driver, according to an embodiment of the invention.

FIG. 4 shows a schematic diagram of a driver 414, according to an embodiment of the invention. Driver 414 can correspond to driver 314 of FIG. 3. As shown in FIG. 4, driver 414 can include a circuit 430 (e.g., a pull-down circuit) coupled to node 499. Circuit 430 can include gates (e.g., AND gates) 401, 403, and 404; transistors 411, 413, and 416; and delays 415 and 417. Circuit 430 can cause a change in the level of the HC signal or hold the level of the HC signal at a voltage V2 (e.g., Vss) at supply node 433, depending on the values of the signals at inputs of gates 401, 403, and 404. Driver 414 can also include a circuit 431 (e.g., a pull-up circuit) coupled node 499. Circuit 431 can include a device (e.g., a pull-up resistor, not shown) to cause a change in the level of the HC signal or to hold the level of the HC signal at voltage V1 (e.g., Vcc) at supply node 432.

Figure 6:
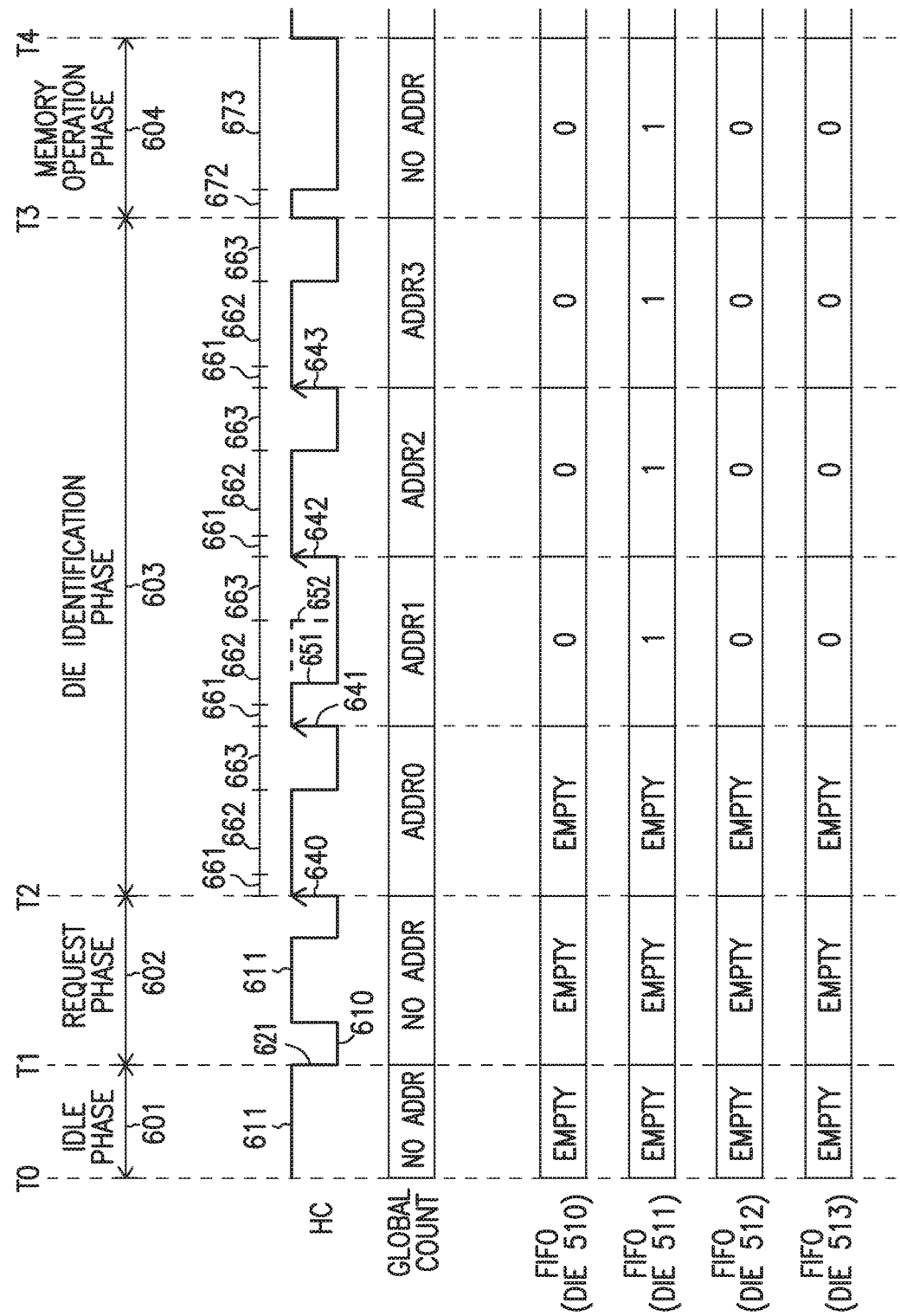
FIG. 6 shows a diagram illustrating a waveform of a signal during different phases in an example operation in the package of FIG. 5, according to an embodiment of the invention.

Signals REQi, ACKi, EN_PDi, ADDR_MATCHi, IDLE, DIE_IDENTIFY, and MEM_OPER can be local signals in each of memory devices 210, 211, 212, and 213 (FIG. 2). The REQi, ACKi, EN_PDi, and ADDR_MATCHi can be activated and deactivated differently among memory devices 210, 211, 212, and 213, depending on which memory device made the request. The IDLE, DIE_IDENTIFY, and MEM_OPER signals can be used to indicate different phases of an operation in arrangement 200. Example waveforms of the signals in FIG. 4 are shown in FIG. 6 though FIG. 8D.

Figure 5:
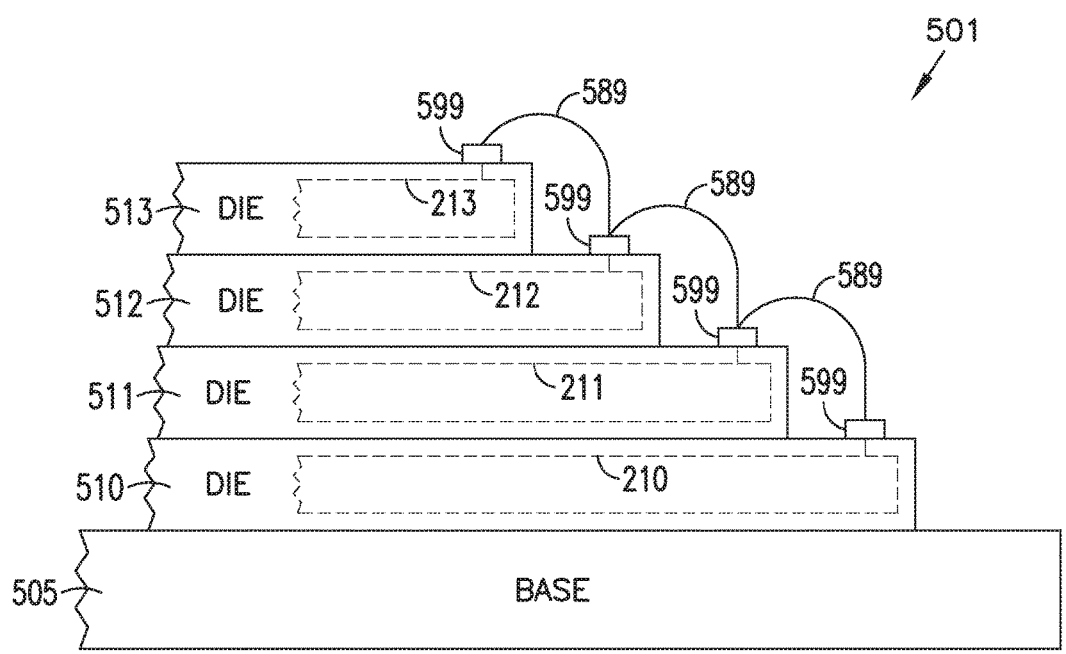
FIG. 5 shows a side view of an apparatus in the form of a structure of a package, according to an embodiment of the invention.

FIG. 5 shows a side view of an apparatus in the form of a structure of a package 501, according to an embodiment of the invention. Package 501 can include memory devices 510, 511, 512, and 513, which can include semiconductor die (e.g., silicon) where electrical devices can be formed. For example, memory devices 510, 511, 512, and 513 can include memory devices 210, 211, 212, and 213, respectively, of FIG. 2. In the embodiment described below, the memory devices are memory dice and, since package 501 includes multiple dice, it can be referred to as a multi-die package. FIG. 5 shows an example of package 501 having four dice 510, 511, 512, and 513. The number of dice in package 501 can vary.

Each of dice 510, 511, 512, and 513 may be assigned a unique die identification (die address or device address). For example, since package 501 includes four dice 510, 511, 512, and 513, four unique die (or device) identifications (IDs) ADDR0, ADDR1, ADDR2, and ADDR3 can be assigned to dice 510, 511, 512, and 513, respectively. Assigning die IDs (e.g., device IDs) to the dice 510, 511, 512, and 513 may be performed during an initialization (e.g., power-up sequence) of package 501.

Package 501 can also include a base 505 coupled to dice 510, 511, 512, and 513. Base 505 can include a substrate (e.g., a package substrate). Communication between dice 510, 511, 512, and 513 and other devices (e.g., a memory controller, a processor, or other devices) coupled to package 501 can be conducted through conductive paths (not shown) included in base 505.

Each of dice 510, 511, 512, and 513 can include a node 599 (which can correspond to node 299 of FIG. 2). Node 599 can include conductive contact that can include single metal, alloy, or other conductive material. Package 501 can include a conductive path coupled to node 599 of each of dice 510, 511, 512, and 513. The conductive path may include at least one wire 589. Node 599 can carry a signal HC, which can correspond to the HC signal of FIG. 1 through FIG. 4. Thus, a change (e.g., a transition) in a level of the HC signal on node 599 can be detectable (e.g., can be recognized) by all dice.

Although not shown in FIG. 5, package 501 can also include other nodes (e.g., conductive contacts) and connections (e.g., wires) in dice 510, 511, 512, and 513. Such nodes and connections may be used to provide control information and commands (e.g., read, write, or erase) and other information between an external device (e.g., a processor or a memory controller) and dice 510, 511, 512, and 513.

FIG. 5 shows dice 510, 511, 512, and 513 being arranged in a staircase arrangement, as an example. Alternatively, dice 510, 511, 512, and 513 may be arranged in other arrangements. In one of such arrangements, the conductive path coupled node 599 of each of dice 510, 511, 512, and 513 may not include a wire (e.g., wire 589) but may include another type of connection, such as through substrate (e.g., through silicon) via (TSV) connection.

FIG. 6 shows a diagram illustrating a waveform of signal HC during different phases in an example operation in package 501 of FIG. 5, according to an embodiment of the invention. As shown in FIG. 6, the phases can include an idle phase 601, a request phase 602, a die identification phase 603, and a memory operation phase 604. Dice 510, 511, 512, and 513 can monitor the level of the HC signal and switch from one phase to another depending on the level of the HC signal.

FIG. 6 shows the HC signal having different levels (e.g., 611 and 610) and rising edges (e.g., 640, 641, 642, and 643) between times T0 and T4 to illustrate an example where a request to perform a stage of an operation has been made by one of dice 510, 511, 512, and 513 (FIG. 5). If no such a request is made between times T0 and T4, then the HC signal may remain (e.g., remain pulled-up) at the same level (e.g., level 611) between times T0 and T4.

In the example of FIG. 6, die 511 is assumed to be the only die that makes a request to perform a particular stage of an operation. The stage of the operation performed by die 511 may (or may not) consume a relatively higher power resource (e.g., a higher current consumption).

As shown in FIG. 6, idle phase 601 can occur between times T0 and T1. The HC signal can be held (e.g., pulled-up) at the same level (e.g., initial level) 611. Level 611 can include a level corresponding to logic "1" (e.g., Vcc).

Request phase 602 can occur between times T1 and T2. Request phase 602 can begin when a request is made (e.g., at time T1) by a die (e.g., die 511) among dice 510, 511, 512, and 513. FIG. 6 shows a change 621 (e.g., a transition) in the level of the HC signal from level 611 to level 610 at time T1 to indicate that a request has been made. Level 610 can include a level corresponding to logic "0" (e.g., Vss). Thus, change 621 can include a transition from one level (e.g., Vcc) to another level (e.g., Vss) in the HC signal. After making the request (e.g., at time T1), die 511 can release the HC signal. The level of the HC signal may go back (e.g., may be pulled-up) to level 611 between times T1 and T2 after it is released by die 511. As shown in FIG. 5, since node 599 is coupled to all dice 510, 511, 512, and 513, change 621 in the level of the HC signal can be detectable by all dice 510, 511, 512, and 513.

Die identification phase 603 can occur between times T2 and T3. The die (e.g., die 511) that made a request can provide information (e.g., die ID or device ID) about its identity. This information may be used by each of dice 510, 511, 512, and 513 to acknowledge (e.g., grant a permission to) the request made by the requesting die. After the request is acknowledged, the die that made the request can perform the stage of the operation.

As shown in FIG. 6, during die identification phase 603, the HC signal can include a pattern of rising edges 640, 641, 642, and 643; and portions 661, 662, and 663. The number of rising edges can be equal to the number of dice. One of dice 510, 511, 512, and 513 can be selected as a master die to generate rising edges 640, 641, 642, and 643 in response to the request. The master die can also drive the HC signal such that portions 661 of the HC signal can be at one level (e.g., Vcc) and portions 663 of the HC signal can be at another level (e.g., Vss). The master die can leave portions 662 of the HC signal at a level (e.g., weak pull-up level), such that the die that made the request can change (e.g., pull-down) the level of portion 662 in order to allow it die ID (or device ID) to be determined.

The global count in FIG. 6 represents counts generated by a counter (e.g., counter 319) in each of dice 510, 511, 512, and 513. The counts generated by dice 510, 511, 512, and 513 can have the same values with respect to time. The counts generated by each die can have a different count value between two different consecutive edges (among edges 640, 641, 642, and 643) of the signal HC signal. Each of the counts can have a count value that matches a unique identity of a die among the dice 510, 511, 512, and 513. For example, the counts can include count values that match die IDs (ADDR0, ADDR1, ADDR2, and ADDR3) of dice 510, 511, 512, and 513, respectively. FIG. 6 shows count values ADDR0, ADDR1, ADDR2, and ADDR3 during specific time intervals between times T2 and T3 to indicate that the count values match the die IDs of dice 510, 511, 512, and 513 during those specific time intervals. For example, the count value during a time interval between rising edges 640 and 641 matches the die ID (ADDR0) of die 510. The count value during a time interval between rising edges 641 and 642 matches the die ID (ADDR1) of die 511, and so on. The count value "NO ADDR" at a particular time interval indicates that, during such particular time interval, the count value does not match any die ID of dice 510, 511, 512, and 513. The count values can be repeated. For example, after memory operation phase 604 is finished, the counter can clear the last count and restart the count from the first count.

During die identification phase 603, the ID of a particular die that made the request can be determined when the count value matches the die ID of that particular die. Providing the die ID can include causing a change (e.g., 651) in one of portions 662 of the HC signal from one level (e.g., Vcc) to another level (e.g., Vss). Based on the combination of the level of portion 662 and the count value, the identity (e.g., die ID) of the die that made the request can be determined. In the example of FIG. 6, die 511 can cause change 651 in portion 662 when the count value matches the die ID (ADDR1) of die 511. FIG. 6 also shows dashed line 652 to indicate that if another die (e.g., one of dice 510, 512, and 513) instead of die 511 made the request, then die 511 would not cause change 651. In this case, the level of portion 662 of the HC signal during count value ADDR1 may remain at its normal level shown by dashed line 652. For example, if die 512 (instead of die 511) made the request, the level of the HC signal between rising edges 642 and 643 can be similar to the level of the HC signal between rising edges 641 and 642 (as shown in FIG. 6), and the level of the HC signal between rising edges 641 and 642 can be similar to the level of the HC signal between rising edges 642 and 643 (as shown in FIG. 6).

During die identification phase 603, a particular die that does not make the request can leave unchanged the level of portion 662 of the HC signal when the count value of the global count matches the die ID of that particular die. In the example associated with FIG. 6, dice 510, 512, and 513 do not make a request. Thus, during die identification phase 603, dice 510, 512, and 513 can leave unchanged (e.g., not pulling down) the level of portions 662 associated with count values that match die IDs ADDR0, ADDR2, and ADDR3.

During die identification phase 603, each of dice 510, 512, and 513 can sample the level of each of portions 662 of the HC signal between times T1 and T3 in order to determine the identity of the die that made the request. Each die can sample the HC signal four times at four portions 662 of the HC signal. Each of dice 510, 511, 512, and 513 can determine which die made the request based on the sampled level of each of portions 662 of the HC signal. In FIG. 6 each of dice 510, 511, 512, and 513 can determine that die 511 is the die that made a request because change 651 has occurred in the level of portions 662 of the HC signal associated with die ID ADDR1 (die ID of die 511). Each of dice 510, 511, 512, and 513 can also determine that die 510, 512, and 513 do not make a request because no change occurred in the level of portion 662 of the HC signal associated with die ID ADDR0, ARRD2, and ADDR3.

FIG. 6 also shows information of a FIFO structure of each of dice 510, 512, and 513. This information can be used to indicate the request is acknowledged. For example, the content of the FIFO of die 511 being "EMPTY" can indicate that no request has been made or that a request has been made but that the request has not been acknowledged. The content of the FIFO of die 511 can be changed from "EMPTY" to "1" to indicate that the request by die 511 is acknowledged. This also indicates that die 511 is next in line (e.g., in a queue) to perform a particular stage of an operation. FIG. 6 also shows the content of the FIFO of dice 510, 512, and 513 being "0" to indicate that none of dice 510, 512, and 513 will perform a particular stage of an operation. Acknowledging the request using the FIFO structure as shown in FIG. 6 (e.g., first request—first acknowledged) may improve the average waiting time between making a request and acknowledging the request. The latency associated with making a request may also be reduced.

Figure 7:
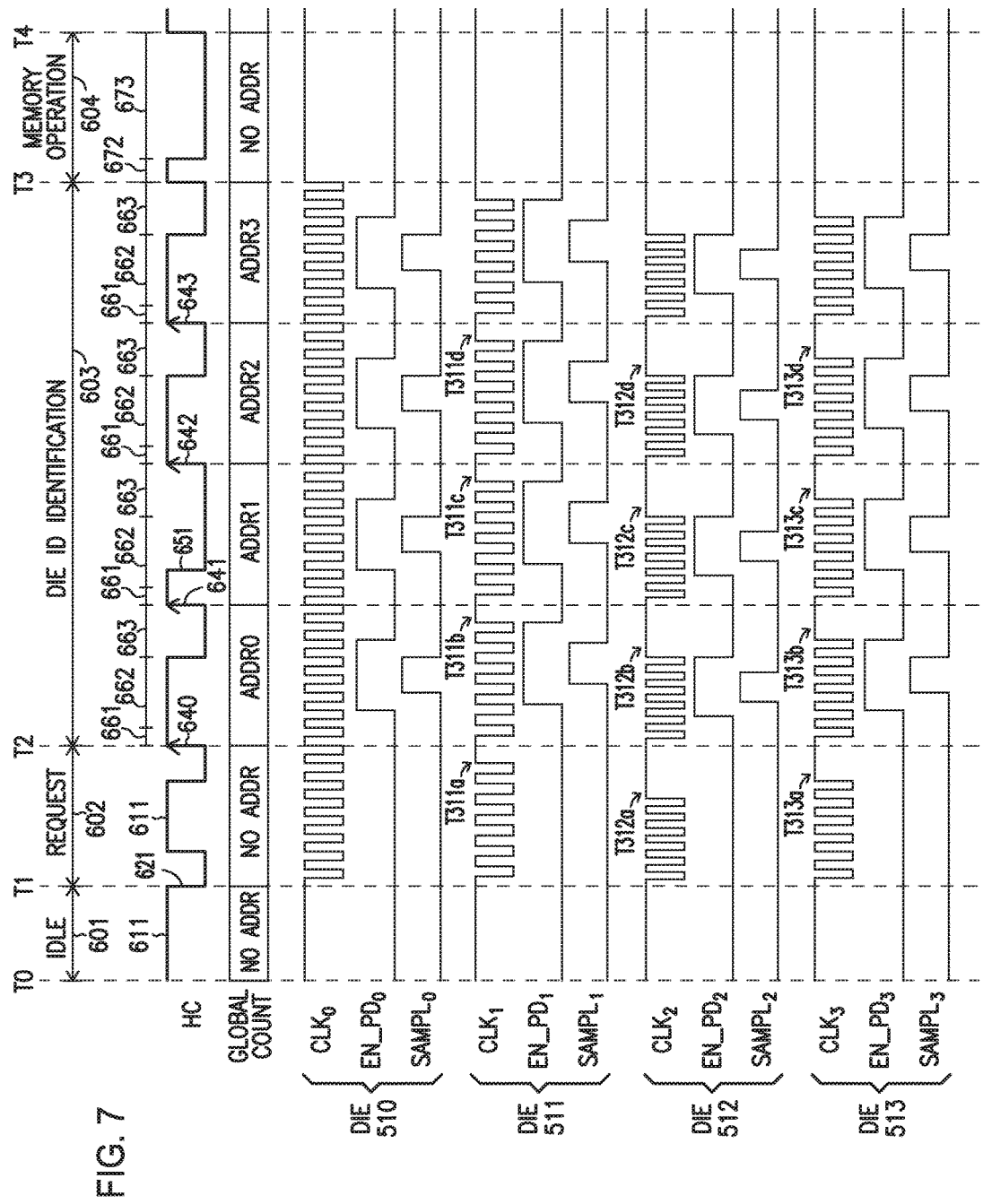
FIG. 7 shows an example timing diagram for some of the signals including clock signals generated by the dice of the package of FIG. 5, according to an embodiment of the invention.

Memory operation phase 604 can occur between times T3 and T4. During this phase, the particular die that made the request can perform the particular stage of an operation associated with the request. In the example associated with FIG. 7, die 511 can cause the level of the HC signal to change from a higher level (e.g., Vcc of portion 672) to a lower level (e.g., Vss at portion 673) to indicate that a particular stage of an operation is being performed. For example, as shown in FIG. 7, portion 673 of the HC signal has a lower level than portion 672 of the HC signal. After memory operation phase 604 is performed, package 501 may go back to idle phase 601 and repeat the process described above with reference to FIG. 6 if another die has made a request.

FIG. 7 shows an example timing diagram for some of the signals including clock signals generated by dice 510, 511, 512, and 513 during phases 601, 602, 603, and 604 in an operation of package 501 of FIG. 5, according to an embodiment of the invention. The HC signal and the global count in FIG. 7 are the same as those described above with reference to FIG. 6.

As shown in FIG. 7, dice 510, 511, 512, and 513 can generate clock signals $CLK_0$, $CLK_1$, $CLK_2$, and $CLK_3$, respectively. Each of the $CLK_0$, $CLK_1$, $CLK_2$, and $CLK_3$ signals can correspond to the CLKi clock signal (FIG. 5) generated by a clock generator (e.g., clock generator 312 in FIG. 3) in a corresponding die. Dice 510, 511, 512, and 513 can use the timing of the $CLK_0$, $CLK_1$, $CLK_2$, and $CLK_3$, respectively, during the process of determining the identity of the die that made a request and also for a process of acknowledging the request.

In FIG. 7, dice 510, 511, 512, and 513 can cause the $CLK_0$, $CLK_1$, $CLK_2$, and $CLK_3$ signals to start oscillating at time T1 in response to change 621. As described above with reference to FIG. 6, change 621 occurs when a request is made by one of dice 510, 511, 512, and 513. Each of dice 510, 511, 512, and 513 can monitor the level of the HC signal and cause its clock generator to start in response to change 621.

Each of dice 510, 511, 512, and 513 can generate an enable signal and a sampling signal based on timing of its own clock signal. For example, die 510 can generate enable signal $EN\_PD_0$ and sampling signal $SAMPL_0$ based on timing of the $CLK_0$ signal. Die 511 can generate enable signal $EN\_PD_1$ and sampling signal $SAMPL_1$ based on timing of the $CLK_1$ signal. Die 512 can generate enable signal $EN\_PD_2$ and sampling signal $SAMPL_2$ based on timing of the $CLK_2$ signal. Die 513 can generate enable signal $EN\_PD_3$ and sampling signal $SAMPL_3$ based on timing of the $CLK_3$ signal.

In each die, the enable signal and the sampling signal can be generated after the clock signal in that die oscillates for predetermined number of X clock cycles and Y clock cycles, respectively, from each of rising edges 640, 641, 642, and 643. X and Y are integers. The value of X clock cycles can be the same for dice 510, 511, 512, and 513. The value of Y clock cycles can be the same for dice 510, 511, 512, and 513. The value of X clock cycles and the value of Y clock cycles can be different.

As shown in FIG. 7, the $CLK_0$ signal generated by die 510 (e.g., master die) can be a free running clock signal between time T1 and T3. The $CLK_0$, $CLK_1$, $CLK_2$, and $CLK_3$ signals generated by corresponding dice (e.g., non-master die) 511, 512, and 513 can oscillate intermittently (e.g., oscillate not as a free running clock signal between times T1 and T3). For example, as shown in FIG. 7, die 511 (non-master die) can cause its clock generator to start (e.g., at time T1) in response to change 621, such that the $CLK_1$ signal can start oscillating at time T1. Then, die 511 can cause its clock generator to stop (e.g., at time T311a) before rising edge 640 occurs. After the $CLK_1$ signal stops oscillating at time T311a, die 511 can cause the $CLK_1$ signal to start oscillating again when rising edge 640 occurs and to stop oscillating at time T311b after the $CLK_1$ signal oscillates for a number of Z clock cycles (Z is an integer). In the same pattern, die 511 can cause the $CLK_1$ signal to start oscillating when each of rising edges 641, 642, and 643 occurs and stop oscillating after Z number of clock cycles, such as stop oscillating at each of times T311b, T311c, and T311d. The $CLK_1$ signal can stop oscillating (e.g., remain at the same level) in memory operation phase 604 and start oscillating again in the request phase.

Dice 512 and 513 can start and stop their corresponding $CLK_2$ and $CLK_3$ signals in ways similar to that of die 511. For example, die 512 can cause its clock generator to start (e.g., at time T1) in response to change 621, such that the $CLK_2$ signal can start oscillating at time T1 and stop oscillating at time T312a before rising edge 640 occurs. Then, die 512 can cause the $CLK_2$ signal to repeat a pattern of starting to oscillate when each of rising edges 640, 641, 642, and 643 occurs and stop oscillating after the $CLK_2$ signal oscillates for Z number of clock cycles (e.g., stop oscillating at times T312a, T312b, T312c, and T312d).

Die 513 can cause its clock generator to start (e.g., at time T1) in response to change 621, such that the $CLK_3$ signal can start oscillating at time T1 and stop oscillating at time T313a before rising edge 640 occurs. Then, die 513 can cause the $CLK_3$ signal to repeat a pattern of starting to oscillate when each of rising edges 640, 641, 642, and 643 occurs and stop oscillating after the $CLK_3$ signal oscillates for Z number of clock cycles (e.g., stop oscillating at times T313a, T313b, T313c, and T313d).

As described above with reference to FIG. 6, during die ID identification phase 603, a die among dice 510, 511, 512, and 513 can cause a change (e.g., change 651) in the level of portion 662 of the HC signal if that die made a request to perform a particular operation. In FIG. 7, the die making the request can cause a change in the level of portion 662 of the HC signal when the count value matches the die ID of that die and when the enable signal of that die is activated (e.g., having a level corresponding to Vcc). Since the enable signal in a die is generated based on the clock signal in that die, causing change 651 in the level of portion 662 of the HC signal using the enable signal is based on timing of the clock signal.

In order to maintain accuracy in causing a change (e.g., change 651) in the level of portions 662 of the HC signal to identify the identity of the die that made the request, dice 510, 511, 512, and 513 can be configured such that the enable signals $EN\_PD_0$, $EN\_PD_1$, $EN\_PD_2$, and $EN\_PD_3$ can be activated within a time interval associated with portions 662.

As described above with reference to FIG. 6, during die ID identification phase 603, each of dice 510, 512, and 513 can sample the level of each of portions 662 of the HC signal between times T1 and T3 in order to determine the identity of the die that made the request. In FIG. 7, each of dice 510, 512, and 513 can sample each of portions 662 between two consecutive rising edges (among rising edges 640, 641, 642, and 643) of the HC signal based on its sampling signal, such as when the its sampling signal is activated (e.g., having a level corresponding to Vcc). Since the sampling signal in a die is generated based on the clock signal in that die, sampling the level of portion 662 of the HC signal using the sampling signal is based on timing of the clock signal.

In order to maintain accuracy in sampling the level of portions 662 of the HC signal to determine the identify of the die that made the request, dice 510, 511, 512, and 513 can be configured such that, during a specific count value, each of the sampling signals $SAMPL_0$, $SAMPL_1$, $SAMPL_2$, and $SAMPL_3$ can be activated within a time interval associated with portions 662 and while at least a portion of each of enable signals $EN\_PD_0$, $EN\_PD_1$, $EN\_PD_2$, and $EN\_PD_3$ is activated during that specific count value.

As shown in FIG. 7, the $CLK_0$, $CLK_1$, $CLK_2$, and $CLK_3$ signals may have different frequencies. This may be caused by local induced variations among the clock generators in dice 510, 511, 512, and 513. Causing the $CLK_1$, $CLK_2$, and $CLK_3$ to start their oscillations based on rising edges 640, 641, 642, and 643 and stop their oscillations after the same number of clock cycles (e.g., Z clock cycle) may allow the $CLK_1$, $CLK_2$, and $CLK_3$ to be synchronized with the $CLK_0$ signal. This allows the $CLK_0$, $CLK_1$, $CLK_2$, and $CLK_3$ signals to be synchronized at specific times T1 and T3. This may also allow dice 510, 511, 512, and 513 to synchronize their respective operations (e.g., operations of identifying the die making the request and sampling the HC signal) based on the level of a single signal (HC signal) at a single node (e.g., node 599 in FIG. 5). Using a single node for the purposes of requesting to perform a particular operation of an operation by die, identify which die made the request, and acknowledging the request, as described above with reference to FIG. 6 and FIG. 7 may reduce the number of nodes (e.g., pads) in a package that may lead to reduced overall cost for the package.

FIG. 8A shows timing for some signals in die 511 during phases 601, 602, 603, and 604 of FIG. 6, according to an embodiment of the invention. The HC signal, global count, $CLK_1$, $EN\_PD_1$, $SAMPL_1$, FIFO structure shown in FIG. 8A are described above with reference to FIG. 6 and FIG. 7. Thus, detailed description of these signals and structure is not repeated.

The $REQ_1$, $ACK_1$, $EN\_PD_1$, $ADDR\_MATCH_1$, IDLE, DIE_IDENTIFY, and MEM_OPER in FIG. 8A can correspond to the REQi, ACKi, EN_PDi, ADDR_MATCHi, IDLE, DIE_IDENTIFY, and MEM_OPER signals, respectively, of FIG. 4.

As shown in FIG. 8A, the IDLE signal can be activated (e.g., from Vss to Vcc) during idle phase 601 and deactivated (e.g., from Vcc to Vss) during the other phases, such as request phase 602, die identification phase 603, and memory operation phase 604. The DIE_IDENTIFY signal can be activated during die identification phase 603 and deactivated during the other phases. The MEM_OPER signal can be activated during memory operation phase 604 and deactivated during the other phases.

At time T1, the $REQ_1$ can be activated (e.g., from Vss to Vcc) in order to cause change 621 in the level of the HC signal. The $REQ_1$ signal can be deactivated (e.g., from Vcc to Vss) at the end of memory operation phase 604 (e.g., at time T4).

The $ADDR\_MATCH_1$ signal can be activated when the count value matches the die ID of die 511. This allows die 511 to determine when to cause change 651 in order to allow its die ID to be determined. The $ACK_1$ signal can be activated when die 511 performs the particular phase of the operation during memory operation phase 604

FIG. 8B shows timing for some signals in die 510 during phases 601, 602, 603, and 604 of FIG. 6, according to an embodiment of the invention. The HC, global count, $CLK_0$, $EN\_PD_0$, $SAMPL_0$, FIFO structure shown in FIG. 8B are described above with reference to FIG. 6 and FIG. 7. Thus, detailed description of these signals and structure is not repeated. The $REQ_0$, $ACK_0$, $EN\_PD_0$, $ADDR\_MATCH_0$, IDLE, DIE_IDENTIFY, and MEM_OPER in FIG. 8B can correspond to the REQi, ACKi, EN_PDi, ADDR_MATCHi, IDLE, DIE_IDENTIFY, and MEM_OPER signals, respectively, of FIG. 4.

As shown in FIG. 8B, the IDLE, DIE_IDENTIFY, and MEM_OPER signals can be activated and deactivated during corresponding phases idle phase 601, die identification phase 603, and memory operation phase 604 in the same fashion as those in FIG. 8A.

The differences between FIG. 8A and FIG. 8B include differences between the $REQ_0$ (FIG. 8B) and $REQ_1$ (FIG. 8A) signals and between the $ACK_0$ (FIG. 8B) and $ACK_1$ (FIG. 8A) signals. As shown in FIG. 8B, the $REQ_0$ and $ACK_0$ signals can remain deactivated (e.g., at Vss) between times T0 and T4 because die 510 does not make a request (as assumed in the above example associated with FIG. 6 and FIG. 7). The $ADDR\_MATCH_0$ signal in FIG. 8B is activated during an interval when global count matches the die ID (e.g., ADDR0) of die 510. However, since die 510 does not make a request, it does not cause a change in the level of portion 662 of the HC. Thus, as shown in FIG. 8B, the level of portion 662 of the HC can remain at level 611 (e.g., pulled-up level) when the global count has count value ADDR0.

FIG. 8C shows timing for some signals in die 512 during phases 601, 602, 603, and 604 of FIG. 6, according to an embodiment of the invention. The $REQ_2$, $ACK_2$, $EN\_PD_2$, $ADDR\_MATCH_2$, IDLE, DIE_IDENTIFY, and MEM_OPER in FIG. 8C can correspond to the REQi, ACKi, EN_PDi, ADDR_MATCHi, IDLE, DIE_IDENTIFY, and MEM_OPER signals, respectively, of FIG. 4.

The signals in FIG. 8C are similar to those of FIG. 8. For example, as shown in FIG. 8C, the $REQ_2$ and $ACK_2$ signals can remain deactivated (e.g., at Vss) between times T0 and T4 because die 512 does not make a request (as assumed in the above example associated with FIG. 6 and FIG. 7). The $ADDR\_MATCH_2$ signal in FIG. 8C is activated during an interval between when the global count matches the die ID (e.g., ADDR2) of die 512. However, since die 512 does not make a request, it does not cause a change in the level of portion 662 of the HC when the global count matches the die ID of die 512. Thus, as shown in FIG. 8C, the level of portion 662 of the HC can remain at level 611 (e.g., pulled-up level) when the global count has count value ADDR2.

FIG. 8D show timing for some signals in die 513 during phases 601, 602, 603, and 604 of FIG. 6, according to an embodiment of the invention. The $REQ_3$, $ACK_3$, $EN\_PD_3$, $ADDR\_MATCH_3$, IDLE, DIE_IDENTIFY, and MEM_OPER in FIG. 8A can correspond to the REQi, ACKi, EN_PDi, ADDR_MATCHi, IDLE, DIE_IDENTIFY, and MEM_OPER signals, respectively, of FIG. 4.

The signals in FIG. 8D are similar to those of FIG. 8B and FIG. 8C. For example, as shown in FIG. 8D, the $REQ_3$ and $ACK_3$ signals can remain deactivated (e.g., at Vss) between times T0 and T4 because die 513 does not make a request (as assumed in the above example associated with FIG. 6 and FIG. 7). The $ADDR\_MATCH_3$ signal in FIG. 8D is activated during an interval between when the global count matches the die ID (e.g., ADDR2) of die 513. However, since die 513 does not make a request, it does not cause a change in the level of portion 662 of the HC when the global count matches the die ID matches the die ID of die 513. Thus, as shown in FIG. 8D, the level of portion 662 of the HC can remain at level 611 (e.g., pulled-up level) when the global count has count value ADDR3.

Figure 9:
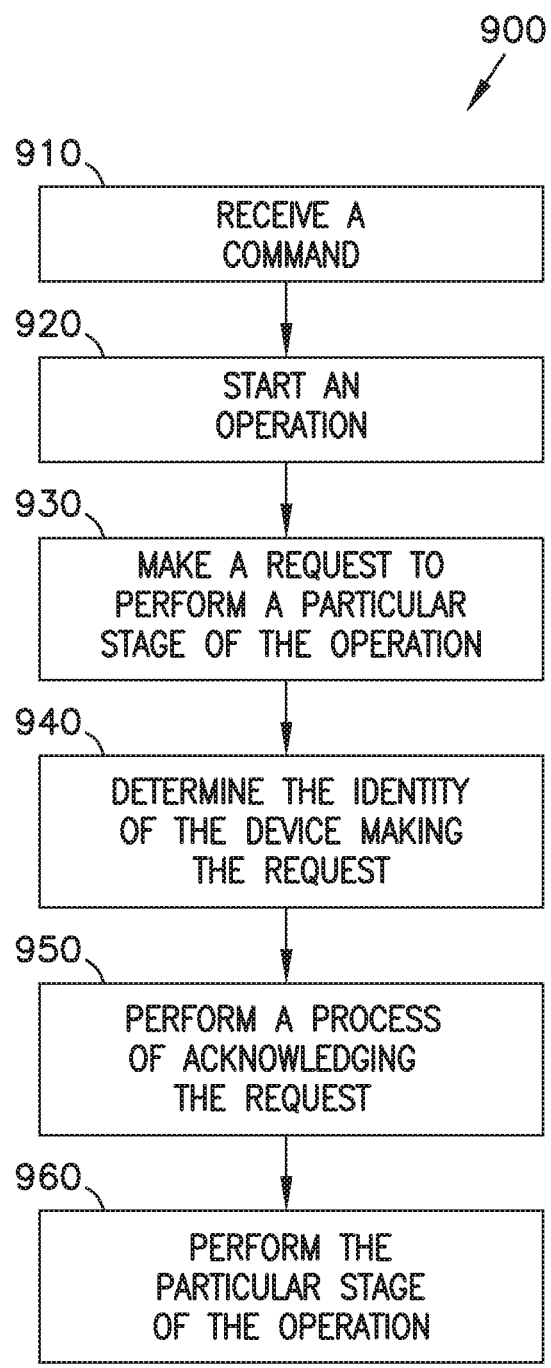
FIG. 9 is a flow diagram showing a method, according to an embodiment of the invention

FIG. 9 is a flow diagram showing a method 900, according to an embodiment of the invention. Method 900 can be performed by a package, such as package 501 of FIG. 5. As shown in FIG. 9, method 900 can include activities 910, 920, 930, 940, 950, and 960. Each of activities 910, 920, 930, 940, 950, and 960 can be performed by a particular device (e.g., die) or by all devices (e.g., all dice) in the package.

Activity 910 can include receiving a command to perform an operation. The command can be sent to the package from a processor or a memory controller. The processor or a memory controller can be external to the package. Alternatively, the processor or a memory controller can be included in the same package with the dice. The command can include a read, write, or erase command. The command can be directed to only one device (e.g., die) among the devices (e.g., dice) in the package. Thus, in activity 910, only one device among the devices in the package may receive the command.

Activity 920 can include starting an operation. The operation can include a read, write, or erase operation based on the command. For example, the operation can include a read operation if the command in activity 910 is a read command. The operation can include a write operation if the command in activity 910 is a write command. The operation can include an erase operation if the command in activity 910 is an erase command. Activity 920 may be performed by only the device that receives the command in activity 910.

Activity 930 can include making a request to perform a particular stage of the operation, such as a particular stage of a read, write, or erase operation. The particular stage may consume a higher resource (e.g., higher current) than another stage of the operation. The request can be made by the device that performs the operation in activity 920 after the operation is started in activity 920. Making the request in activity 930 can include causing a change in a signal (e.g., a HC signal) at a node coupled to all devices in the package.

Activity 940 can include determining the identity (e.g., die ID) of the device that made the request. Activity 940 can be performed by all devices in the package. Determining the identity in activity can include the device making the request causing a change in the signal at the node. This change is in addition to the change to the signal at the node caused by the device making the request in activity 930.

Activity 950 can include performing a process of acknowledging the request. The process of acknowledging the request can include storing information associated with the request. Such information can be stored in an arbiter (which may include a FIFO structure in each of the dice). Activity 950 can be performed by all dice in the package. The arbiter may be arranged to determine which device will perform the particular stage of the operation. If multiple (e.g., two or more) requests are made by multiple devices, the process of acknowledging the request can also include determining an order at which the particular stages (associated with the respective requests) are to be performed by corresponding devices.

Activity 960 can include performing the particular stage of the operation after the request is acknowledged.

Method 900 may include fewer or more activities than the activities shown in FIG. 9. For example, method 900 can include operations and activities described above with reference to FIG. 1 through FIG. 8D.

The illustrations of the apparatuses (e.g., memory device 100, arrangement 200, and package 501) and methods (e.g., method 900 and operations performed by memory device 100, arrangement 200, and package 501) are intended to provide a general understanding of the structure of various embodiments and are not intended to provide a complete description of all the elements and features of an apparatus that might make use of the structures described herein.

The apparatuses (e.g., memory device 100, arrangement 200, and package 501, or part of memory device 100, arrangement 200, or package 501, including memory control unit 116 and memory control unit 216) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

The apparatuses (e.g., memory device 100, arrangement 200, and package 501) described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9 include apparatuses and methods having a node to couple to a plurality of dice, memory cells, and a module to perform an operation on the memory cells, to cause at least one change in a level of a signal at the node in order to make a request to perform a particular stage of the operation such that the request is detectable by the dice, and to perform the particular stage of the operation after the request is acknowledged. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
a node included in a die of a memory device to couple to a plurality of additional memory devices;
memory cells included in the die of the memory device; and
a module included in the die of the memory device to perform an operation on the memory cells, to cause at least one change in a level of a signal at the node in order to make a request to perform a particular stage of the operation such that the request is detectable by the plurality of memory devices, and to perform the particular stage of the operation after the request is acknowledged, wherein the memory device includes a clock generator to generate a clock signal, each die of the plurality of additional memory devices includes an additional clock generator to generate an additional clock signal, and the clock signal generated by the memory device is different from the additional clock signal generated by each die of the plurality of additional memory devices.

2. The apparatus of claim 1, wherein the apparatus comprises another memory device coupled to the node.

3. The apparatus of claim 1, wherein the module includes an arbiter responsive to the at least one change in the level of the signal to acknowledge the request.

4. The apparatus of claim 3, wherein the arbiter includes a first-in-first-out structure.

5. The apparatus of claim 1, wherein the module is configured to use timing of the clock signal during a process to acknowledge the request.

6. The apparatus of claim 5, wherein the module is configured to stop oscillating the clock signal when the particular stage of the operation is performed.

7. The apparatus of claim 1, wherein each die of the plurality of additional dice includes an arbiter configured store information associated with the request and to allow the stage of the operation to be performed based on an order indicated by the information.

8. The apparatus of claim 1, wherein the memory device is configured to charge at least one data line associated with the memory cells when the particular stage of the operation is performed.

9. The apparatus of claim 1, wherein the node is part of a conductive path coupling to the memory device the plurality of additional memory devices, and the conductive path includes a conductive wire.

10. A method comprising:
starting an operation on memory cells included in a die of a memory device;
making a request, performed by a module of included in the die of the memory device, to perform a particular stage of the operation, wherein making the request includes causing a first change in a level of a signal at a node included in the die of the memory device during a first time interval;
causing a second change in a level of the signal on the node during a second time interval in a process of acknowledging the request; and
performing the stage of the operation after the request is acknowledged;
generating a clock signal at the memory device;
generating an additional clock signal at each die of a plurality of additional memory devices, the plurality of additional memory devices coupled to the node, wherein the clock signal generated by the memory device is different from the additional clock signal generated by each die of the plurality of additional memory devices.

11. The method of claim 10, wherein the operation includes a read operation.

12. The method of claim 10, wherein the operation includes a write operation.

13. The method of claim 10, wherein the operation includes an erase operation.

14. The method of claim 10, wherein the stage of the operation consumes a higher amount of current than another stage of the operation.

15. The method of claim 10, wherein the clock signal is generated in response to the first change in the level of the signal, and causing the second change in the level of the signal is based on timing of the clock signal.

16. The method of claim 10, further comprising:
changing content of an arbiter when the request is acknowledged.

17. The method of claim 16, wherein performing the stage of the operation follows an order based on the content of the arbiter.

18. The method of claim 10, wherein causing each of the first and second changes in the level of the signal at the node includes causing the level of the signal to change from a higher level to a lower level.

* * * * *